United States Patent [19]

Dall'Oglio

[11] Patent Number: 5,032,731
[45] Date of Patent: Jul. 16, 1991

[54] SENSOR AND DEVICE FOR THE MEASUREMENT OF RADIANT ENERGY, IN PARTICULAR THE ENERGY ASSOCIATED WITH RADIO-FREQUENCY, MICROWAVE AND LIGHT RADIATION SIGNALS

[75] Inventor: Giorgio Dall'Oglio, Milan, Italy

[73] Assignee: Eslab, S.r.l., Italy

[21] Appl. No.: 451,098

[22] Filed: Dec. 15, 1989

[30] Foreign Application Priority Data

Dec. 16, 1988 [IT] Italy .............................. 22969 A/88

[51] Int. Cl.$^5$ ..................... G01K 11/00; G01J 3/443
[52] U.S. Cl. ................................ 250/458.1; 374/32; 374/161
[58] Field of Search .................... 250/458.1, 459.1; 374/161, 32

[56] References Cited

U.S. PATENT DOCUMENTS

| | | | |
|---|---|---|---|
| 3,384,819 | 5/1968 | Rinkel | 374/32 |
| 3,459,945 | 8/1969 | Astheimer et al. | 374/32 |
| 4,768,886 | 9/1988 | Hirschfeld et al. | 374/161 |

OTHER PUBLICATIONS

Sholes et al., "Fluorescent Decay Thermometer with Biological Applications", Rev. Sci. Instrum. 51 (7), Jul. 1980, pp. 882-884.

Primary Examiner—Carolyn E. Fields
Attorney, Agent, or Firm—Kirschstein, Ottinger, Israel & Schiffmiller

[57] ABSTRACT

The sensor provides a termination for the guide along which the signal is propagated, which termination is capable of completely absorbing the incident energy and converting it into heat. The termination is in thermal contact with a monocrystal or with a layer of crystals, for example of ruby (oxide of aluminium), which is capable of being illuminated by one or more sources of light with a predetermined and sinusoidally modulated wavelength, in order to emit fluorescent radiation at a second wavelength, the phase displacement of which with regard to the modulating phase is a function of the temperature of the termination, and thus a function of the incident energy.

For radio-frequency and microwave measurements, the termination terminates the coaxial cable or the waveguide with the characteristic impedance and comprises a layer of metal deposited on the monocrystal or on the layer of ruby crystals.

In the case of measurements of optical power, the termination is constituted by a black body which the input optical fiber abuts, the black body being in a thermal exchange relationship with the monocrystal or with the layer of ruby crystals.

15 Claims, 2 Drawing Sheets

SENSOR AND DEVICE FOR THE MEASUREMENT OF RADIANT ENERGY, IN PARTICULAR THE ENERGY ASSOCIATED WITH RADIO-FREQUENCY, MICROWAVE AND LIGHT RADIATION SIGNALS

BACKGROUND OF THE DISCLOSURE

1. Field of the Invention

The present invention relates to the measurement of energy and power associated with electromagnetic radiation, in particular with radio-frequency, microwave and light radiation signals.

More specifically, the invention relates to a sensor and a bolometric device for measuring energy and power in radio-frequency, microwave and optical-type circuits.

2. Description of Related Art

Measurements of energy and power in radio-frequency and microwave circuits are at present carried out with devices of various types according to the field of use. Measurements of this type are in fact rather delicate and are based on the use of various types of sensors according to the power range to be measured. The powers in question in fact vary across a very wide range which extends through various orders of size, typically from −70 dBm to +30 dBm and beyond. In order to cover such a range, known instruments use various types of sensor for the detection of the radio-frequency energy, such as calorimetric or bolometric sensors, sensors with thermocouples and with diodes, according to the field of use. These sensors, as well as the associated devices, have serious limitations as far as applicability, precision, stability and other parameters are concerned. For example, diodes can be used in the low band of power, while thermocouples are preferably used in the high band, with the result of limiting the field of use of the instruments, or requiring complex solutions in order to change the range of the instruments and similar. Further disadvantages of known sensors, in particular of high-sensitivity models with diodes, are represented by high values of maladjustment at the various frequencies (high standing-wave ratios); calibration and compensation are necessary for each sensor in order to take account of the individual characteristics of the diodes; and there is limited capacity for withstanding power transients. As far as measurements of energy and power with regard to light radiation are concerned, these are carried out with instruments of various types, such as for example the volt-ampere meters HP 8152A, 8151A and similar, despite the interaction and the combined use, which are ever more frequent, of signals of the electrical type and signals of the optical type.

SUMMARY OF THE INVENTION

The aim of the present invention is therefore to make possible measurements of energy and power in radio-frequency, microwave and optical circuits with a device of standardized type which is of simple construction and has a wide range of measurement and a very limited cost. These aims are achieved by means of the invention which consists of a sensor for the measurement of energy being propagated in a guide, characterized in that it comprises:

a termination element connected to the said guide and capable of absorbing the incident energy by transforming it into thermal energy;

a layer of crystalline material in a thermal exchange relationship with the termination element;

at least one source of light radiation with a first predetermined wavelength, capable of stimulating the emission by fluorescence of the layer of crystalline material at a second wavelength, and a photoelectric detector for the radiation emitted by the layer of crystalline material. Preferably the layer of crystalline material is constituted by a monocrystal cut to the desired thickness, or by a layer of crystals made of ruby or other material suitable for the production of a crystal laser, and the sensor comprises at least two filters for the selection of the said wavelengths.

According to a particularly preferred embodiment, which is suitable for the measurement of radio-frequency or microwave energy, the waveguide is constituted by a coaxial cable and the sensor is characterized in that the termination element has a resistive ohmic value equal to the characteristic impedance of the coaxial cable, being in particular constituted by a metallic layer deposited by sputtering on the layer of ruby crystals.

The invention also consists of a device for the measurement of energy being propagated in a guide, using a sensor of the type indicated above, characterized in that it comprises:

a sinusoidal oscillator connected to the said source, of which there is at least one, in order to modulate the emission of the first wavelength;

a comparator circuit, the inputs of which are connected to the output of the photodetector and to the sinusoidal oscillator in order to measure the phase difference between the sinusoidal modulation signal and the sinusoidal output signal from the photodetector, and means of processing the signal produced by the comparator in order to calculate the value of the incident energy and/or power.

BRIEF DESCRIPTION OF THE DRAWINGS

These and other features o- the invention, and the associated advantages also, will become clear from the description which follows of some preferred, but not limitative, embodiments of the invention in conjunction with the attached drawings in which.

DETAILED DESCRIPTION OF THE PREFERRED EMBODIMENTS

In the continuation description reference will be made only to the element heated (absorption layer); in reality, a differential measurement is always carried out, comparing the temperature of the sensor element with that of an identical element which is not reached by the radiation to be measured and is intended to detect the ambient temperature.

The measurement is thus reduced to that of the variation in temperature due to the radiation, as the effect of the ambient temperature is eliminated by virtue of the differential measurement. For the purposes of the description of the invention it is, however, sufficient to describe only once the heat-sensitive element and the associated method of measurement of its temperature, as the two detectors used for the differential measurement are identical and the single operational difference is that only one is reached by the radiation.

It is hardly necessary to refer to the possibility of carrying out the measurement of the ambient temperature with another type of detector, for example a thermoresistor, a thermistor or other, in which case the differential measurement would be carried out between the value detected by the sensor element and a reference table from which the value would be chosen according to the ambient temperature.

In the description which follows, the terms light and optical refer to electromagnetic radiations which are not necessarily visible to the human eye and are capable of being propagated in a guided manner.

Figure 1:
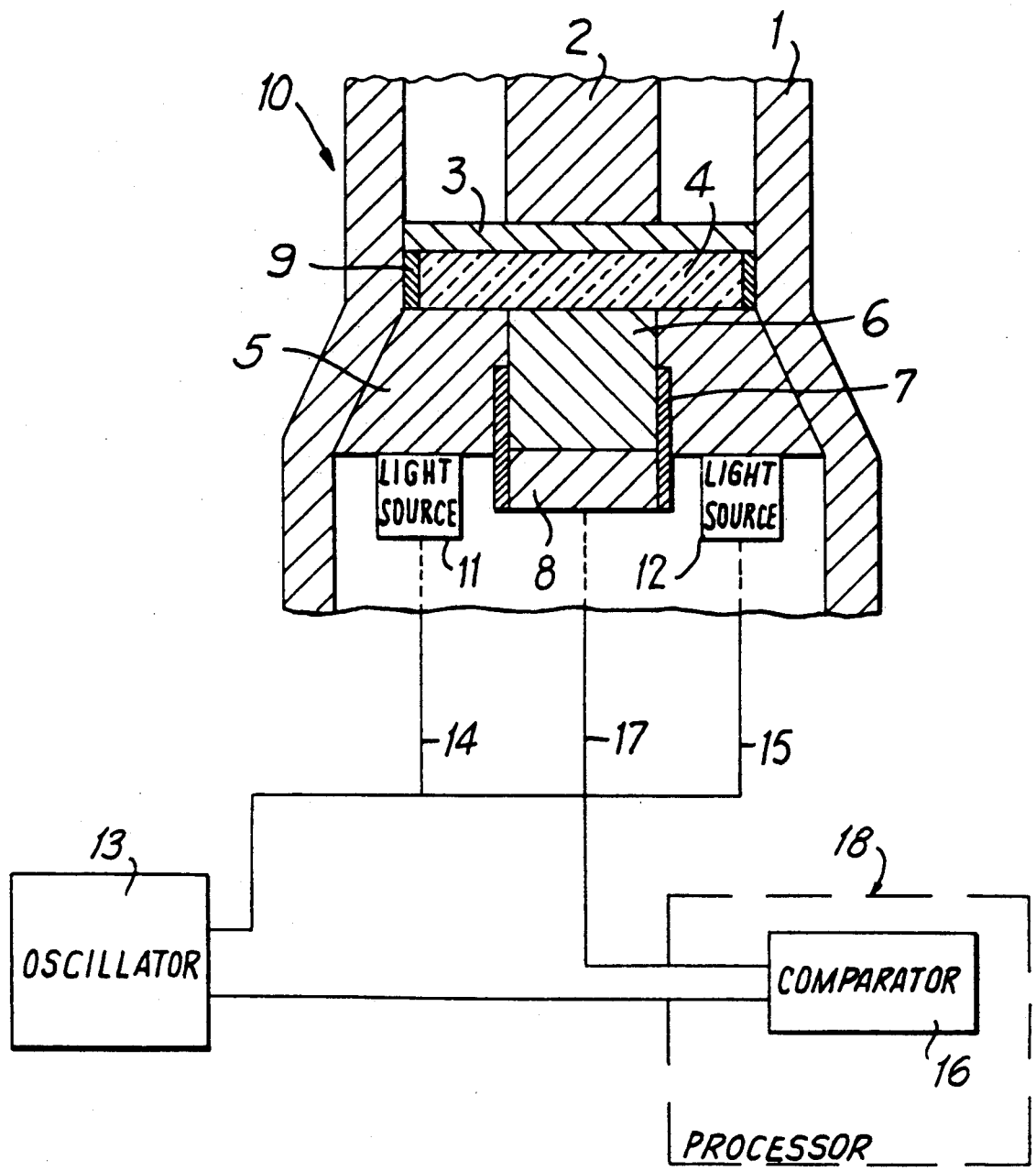
FIG. 1 shows schematically the sensor according to the invention, in the version for radio-frequency measurements in coaxial cable, connected to the device.

With reference to FIG. 1, the device according to the invention, and the associated sensor, will now be illustrated, in the case of radio-frequency measurements. The sensor, in the form of a measuring head, provides for the absorption of energy which is incident upon a thin element (resistive termination) made of metal, or of resistive alloys or of carbon, constructed on a layer of synthetic ruby with a limited chromium content (pink ruby).

The layer can be obtained from a monocrystal cut to the desired thickness or as a layer formed from a number of crystals using known methods.

According to a preferred embodiment, the crystalline material is constituted by an oxide of aluminium ($Al_2O_3$), also known as pink ruby, doped with a trivalent chromium ($Cr^{3+}$). However, other types of crystal can also be used, in particular those which are suitable for the production of crystal lasers. The energy received by the absorption layer, which constitutes the termination of the guide along which the radiation to be measured is propagated, is transformed into an increase in temperature of the termination which, in turn, induces a variation in temperature in the synthetic ruby. This variation can be detected optically by measuring the phase delay between an appropriate optical excitation signal and the optical fluorescence signal induced in the ruby.

In FIG. 1, which relates to a bolometric detector for signals up to microwaves, the sensor 10 is applied to the end of a coaxial cable or system which has an external electrode 1 and an internal electrode 2.

The sensor comprises a metallic termination layer 3 which terminates the coaxial system and is in thermal contact with a layer 4 of crystals or with a monocrystal of pink ruby.

The layer 4 of monocrystal or of ruby crystals can be illuminated with one or more sources of light radiation which are produced, for example, as shown in FIG. 1, by means of one or more low-pass optical filters 5 arranged in an annular manner on one face of the layer 4, and one or more light radiation generators 11, 12. The filter or filters 5 allow the passage of radiation with a wavelength of 560 nm but not of that with a wavelength of 694 nm while the light radiation generators 11, 12 are preferably constituted by light-emitting diodes (LEDs) which are preferably connected by means of pieces made of optical fibers to the filters 5. On the central part of the layer 4, a second high-pass optical filter 6 is provided in order to block radiation with a wavelength of 560 nm and to allow that with longer wavelengths to pass, in particular the length 694 nm which corresponds to the light radiation emitted by fluorescence from the layer 4 when it is excited with the light radiation with the first wavelength of 560 nm. The filters 5 and 6 have blocking characteristics in the range between the two wavelengths.

Between the filters 5 and 6, an optical splitter 7 is arranged, and the output of the filter 6 is connected to a photoelectric detector 8 which is capable of generating a signal which is representative of the light radiation emitted by fluorescence.

In the device shown in FIG. 1, the light sources 11, 12 are supplied by means of connections 14, 15 from an oscillator 13 which sinusoidally modulates the control signal, in such a manner that the radiation emitted from the diodes also becomes sinusoidally modulated.

The output 17 of the photoelectric detector 8 is connected to one input of the comparator 16, to the other input of which the modulation signal originating from the oscillator 13 is conducted.

The comparator 16 forms part of a circuit 18 which comprises means of processing, calibration and display which make possible the desired measurements of power and energy and which, being of conventional type, are not further illustrated.

The functioning of the sensor and of the device illustrated in FIG. 1 is the following. The microwave energy to be measured is incident upon the termination 3 which is dimensioned so as to produce a resistive element with an ohmic value equal to the characteristic impedance of the coaxial guide formed by the electrodes 1 and 2. In this manner, substantially all the incident energy is dissipated in the termination, that is to say without appreciable reflections (standing wave ratio substantially equal to 1), and therefore the thermal energy received by the termination 3 is a function of the incident energy. This termination is also produced to have an extremely modest thermal mass, as will be illustrated, so as to have a high speed of response. The layer 4 of monocrystal or of ruby crystals is in intimate thermal contact with the layer 3 and therefore its temperature is directly dependent upon the temperature of the metallic element 3 in which the incident energy is totally dissipated.

For each incident energy value, an asymptotic law is established in relation to time, an increase in temperature of the termination depending upon the conditions of thermal equilibrium with the surrounding structures.

The light energy emitted by the sources 11, 12 on the wavelength 560 nanometers, passes through the filters 5 and reaches the layer of pink ruby 4. Part of the said energy is absorbed by the ruby layer 4 while the remaining part is reflected towards the filter 6, through which it cannot pass as this filter is characterized by the wavelength 694 nanometers. In this manner, the scattered light energy cannot reach the photoelectric detector 8. That part of the energy which reaches the ruby layer 4 causes in the same the emission of a fluorescent light (with a doping of trivalent chromium of 0.05% at 694 nanometers) and the energy emitted in this manner can reach the photoelectric detector 8 by passing through the filter 6. (In the event of doping equal to 0.5%, the radiation emitted would be approximately 702 nanometers). The law of emission of fluorescence is characterized by a decay time which is dependent upon the temperature of the crystal in relation to a law of pulse-type excitation. Therefore, if the law of excitation is of sinusoidal type in relation to time, the fluorescent light is also of sinusoidal type in relation to time and with the same frequency, but with a phase delay linked to the excitation according to the mathematical relationship:

$$tg\phi = ft$$

where $\phi$ is the angle of phase delay, f the frequency of the excitation law, and t is the characteristic time which is a direct function of the temperature of the ruby crystal 4.

Therefore, measurement of the phase displacement between the sinusoidal electric control signals of the sources 11, 12 and the sinusoidal electric signal generated by the photoelectric detector 8 can be directly correlated with the temperature of the ruby crystals 4 and makes it possible to measure the value of the said temperature with purely optical means This phase displacement can be measured preferably on a plurality of samples taken according to known techniques, and successively integrated. If the microwave signal is constant or varies slowly in relation to the speed of asymptotic settling of the temperature of the crystal, it is possible to measure the effective power value of the microwave signal. However, this signal can also be measured in a much shorter time, by measuring the gradient of the initial section of the law of asymptotic variation, without waiting for the settling of the increase in temperature, by means of known circuits incorporated into the block 18.

A preferred embodiment of the layers 3 and 4 provides for the deposition by means of sputtering of a metallic layer, in particular of tantalum, on a ruby crystal with a chromium content of 0.05%. The layer of tantalum has a thickness of the order of a few hundred Angstroms and is deposited in an atmosphere of inert gas with 10% nitrogen. In this manner a termination is produced which has an impedance value equal to the characteristic impedance of the system so as to render the reflected power zero, and at the same time an intimate bond is formed between the metallic layer of the termination and the layer of ruby crystals As has been indicated, other crystalline materials can also be used to produce the layer 4, and in general all crystals which are suitable for the construction of crystal lasers.

Furthermore, the operating temperature is not necessarily the ambient temperature. For example, a crystal of synthetic ruby with a concentration of trivalent chromium of 0.05% can be used at ambient temperature with an emitted wavelength of 694 nm, while at a temperature lower than 70° K. at which the sensor can be kept, the emitted length is 700 nm. As some sources (for example gallium arsenide LEDs) could not function at these temperatures, the sources can be positioned outside and at a distance from the sensor, which is kept in a Dewar flask or similar cryogenic system, and the excitation light radiation is in this case conducted to the crystal by means of optical fibers.

Another crystal which functions at ambient temperature is the $Y_3Al_5O_{12}$ crystal with trivalent Nd as dopant, which is used for YAG lasers and emits at approximately 1065 nm. In the variant of the sensor illustrated in FIG. 2, the guide 20 in which the signal is propagated is a waveguide formed by a metallic surface 17 and the sensor provides for components which are functionally similar, with the difference that the termination 3 is dimensioned so as to have an adequate characteristic impedance.

Figure 3:
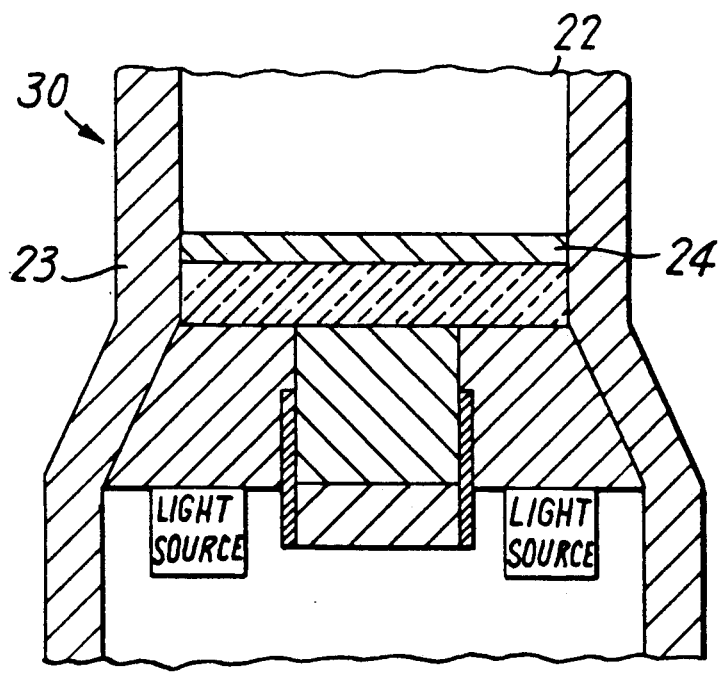
FIG. 3 shows an embodiment of the sensor for light radiation measurements.

In FIG. 3, the embodiment of a sensor 30 is shown which is suitable for the measurement of light energy, in which an optical fiber 22 provided with a protective casing 23 is terminated on a layer 24 formed by deposition of metals with high surface granulosity, so as to constitute a black body which completely absorbs the incident light radiation and transforms it into heat.

Figure 2:
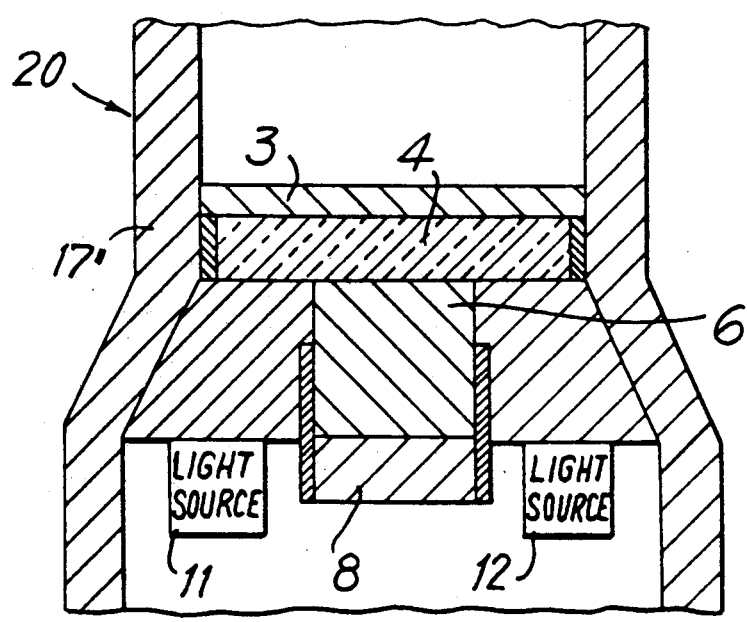
FIG. 2 shows schematically an embodiment of a sensor which is suitable for higher frequency measurements in a waveguide.

In FIGS. 2 and 3, those elements which correspond or are substantially similar to those in FIG. 1 are indicated by the same numerical references.

In the event of sensors being provided for use at low temperatures, they are accommodated in a cryogenic container and, if necessary, the sources 11 and 12 are external and connected to the sensor by means of optical fibers.

I claim:
1. A sensing device for measuring electromagnetic energy propagating along a path in a guide to which the device is fitted during measuring, said device comprising:
    (a) a termination matched to the guide and mounted in the path to substantially absorb the electromagnetic energy impinging on the termination without substantially reflecting the electromagnetic energy therefrom, thereby heating the termination to a temperature;
    (b) crystalline means in a heat-exchange relationship with the termination, for emitting fluorescent radiation of a first wavelength when illuminated by light of a second wavelength;
    (c) means coupled to the crystalline means, for illuminating the crystalline means with light of the second wavelength to actuate the crystalline means to emit fluorescent radiation of the first wavelength; and
    (d) detector means coupled to the crystalline means, for detecting the emitted fluorescent radiation, and for generating an output signal having a n output parameter dependent on the temperature of the termination and, in turn, on the electromagnetic energy propagating along the guide.
2. The sensing device according to claim 1, wherein the guide is a coaxial cable having a characteristic resistance, and wherein the termination has a resistance matched to the characteristic resistance.
3. The sensing device according to claim 1, wherein the guide is a waveguide having a characteristic impedance, and wherein the termination has an impedance matched to the characteristic impedance.
4. The sensing device according to claim 1, wherein the guide is an optical fiber for conveying light, and wherein the termination is an optical black body for substantially absorbing all the light conveyed along the fiber.
5. The sensing device according to claim 1, wherein the termination is a metallic termination layer, and wherein the crystalline means is a crystalline layer in thermal contact with the termination layer.
6. The sensing device according to claim 5, wherein the termination layer is tantalum sputtered onto the crystalline layer.
7. The sensing device according to claim 5, wherein the crystalline layer is a monocrystal.
8. The sensing device according to claim 5, wherein the crystalline layer includes a plurality of crystals.

9. The sensing device according to claim 5, wherein the crystalline layer is constituted by an oxide of aluminum doped with a trivalent chromium.

10. The sensing device according to claim 5, wherein the illuminating means includes at least one light source for illuminating a first portion of crystalline means, and wherein the detector means includes a photodetector facing a different second portion of the crystalline means.

11. The sensing device according to claim 10, wherein said at least one light source emits light of said second wavelength which is lower than said first wavelength of fluorescent radiation.

12. The sensing device according to claim 11, wherein the detector means includes a low-pass filter for allowing said light of said second wavelength to pass from said at least one light source to the crystalline means, and a high-pass filter for allowing said fluorescent radiation of said first wavelength to pass from the crystalline means to the photodetector.

13. The sensing device according to claim 1, wherein the termination crystalline means, illuminating means and detector means are concentrically mounted on a common axis.

14. An arrangement for measuring electromagnetic energy propagating along a path in a guide, said arrangement comprising:
   (a) a sensor housing fitted to the guide during measuring;
   (b) a termination having an impedance matched to the guide and mounted in the housing and in the path to substantially absorb the electromagnetic energy impinging on the termination without substantially reflecting the electromagnetic energy therefrom, thereby heating the termination to a temperature;
   (c) crystalline means mounted in the housing and in a heat-exchange relationship with the termination, for emitting fluorescent radiation of a first wavelength when illuminated by light of a second wavelength;
   (d) means coupled to the crystalline means in the housing, for illuminating the crystalline means with light of the second wavelength to actuate the crystalline means to emit fluorescent radiation of the first wavelength;
   (e) detector means coupled to the crystalline means in the housing, for detecting the emitted fluorescent radiation, and for generating an output signal having an output parameter dependent on the temperature of the termination; and
   (f) processor means electrically connected to the detector means, for processing the output signal to determine the output parameter and, in turn, the electromagnetic energy propagating along the guide.

15. The arrangement according to claim 14, wherein the processor means includes a modulator for generating a reference modulated signal, and a control modulated signal for controlling the illuminating means to modulate the output signal, and further comprising means for comparing the phase of the modulated output signal with the corresponding phase of the reference modulated signal.

* * * * *